(12) United States Patent
Zhu et al.

(10) Patent No.: US 11,475,837 B2
(45) Date of Patent: Oct. 18, 2022

(54) SILICON-BASED ORGANIC LIGHT-EMITTING DIODE DISPLAY DEVICE AND SILICON-BASED ORGANIC LIGHT-EMITTING DIODE DISPLAY METHOD

(71) Applicant: BOE Technology Group Co., Ltd., Beijing (CN)

(72) Inventors: Zhijian Zhu, Beijing (CN); Yu Ao, Beijing (CN); Pengcheng Lu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 27 days.

(21) Appl. No.: 17/257,843

(22) PCT Filed: Mar. 27, 2020

(86) PCT No.: PCT/CN2020/081857
§ 371 (c)(1),
(2) Date: Jan. 4, 2021

(87) PCT Pub. No.: WO2021/189485
PCT Pub. Date: Sep. 30, 2021

(65) Prior Publication Data
US 2022/0130330 A1    Apr. 28, 2022

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3283* (2013.01);
(Continued)

(58) Field of Classification Search
CPC .. G09G 3/3233; G09G 3/3266; G09G 3/3283; G09G 2300/0413;
(Continued)

(56) References Cited

U.S. PATENT DOCUMENTS 9,093,023 B1 * 7/2015 Kim ............... H01L 27/3223
2014/0183481 A1 * 7/2014 Lee ................. G09G 3/3283
257/40

(Continued)

FOREIGN PATENT DOCUMENTS

CN     104461763 A    3/2015
CN     108288661 A    7/2018
(Continued)

*Primary Examiner* — Kwang-Su Yang
(74) *Attorney, Agent, or Firm* — Ling Wu; Stephen Yang; Ling and Yang Intellectual Property

(57) ABSTRACT

A display substrate, a display method and a display device are disclosed. The display substrate includes a display region and an offset region surrounding the display region. The display substrate includes a silicon-based substrate, an emitting structure layer arranged on the silicon-based substrate. The first pixel driving circuits are connected with the emitting structure layer of the display region, and at least part of the first pixel driving circuits are configured to provide driving signals for the emitting structure layer electrically connected with the first pixel driving circuits during normal display. The second pixel driving circuits are connected with the emitting structure layer of the offset region, and at least part of the second pixel driving circuits are configured to provide no driving signals for the emitting structure layer electrically connected with the second pixel driving circuits during normal display.

9 Claims, 7 Drawing Sheets

(51) Int. Cl.
  *G09G 3/3283* (2016.01)
  *H01L 27/32* (2006.01)
  *H01L 51/00* (2006.01)
  *H01L 51/56* (2006.01)
(52) U.S. Cl.
  CPC .......... *H01L 27/322* (2013.01); *H01L 27/326* (2013.01); *H01L 27/3223* (2013.01); *H01L 51/0096* (2013.01); *H01L 51/56* (2013.01); *G09G 2300/0413* (2013.01); *G09G 2300/0842* (2013.01); *G09G 2310/08* (2013.01); *G09G 2320/0295* (2013.01); *G09G 2320/043* (2013.01); *G09G 2340/0464* (2013.01); *H01L 2227/323* (2013.01)
(58) Field of Classification Search
  CPC ..... G09G 2300/0842; G09G 2320/043; G09G 2340/0464; H01L 27/322; H01L 51/0096; H01L 51/56; H01L 2227/323
  See application file for complete search history.

(56) References Cited

U.S. PATENT DOCUMENTS

| | | | |
|---|---|---|---|
| 2015/0277193 A1 | 10/2015 | Kim et al. | |
| 2016/0161781 A1 | 6/2016 | Chiu et al. | |
| 2018/0212011 A1* | 7/2018 | Lai | H01L 27/3258 |
| 2021/0118959 A1* | 4/2021 | Sano | H01L 27/3218 |
| 2021/0173268 A1* | 6/2021 | Yamashita | G02F 1/136263 |

FOREIGN PATENT DOCUMENTS

| | | |
|---|---|---|
| CN | 109283996 A | 1/2019 |
| CN | 109828688 A | 5/2019 |
| CN | 109976021 A | 7/2019 |
| CN | 110211508 A | 9/2019 |
| CN | 110660337 A | 1/2020 |
| TW | 201621490 A | 6/2016 |

* cited by examiner

SILICON-BASED ORGANIC LIGHT-EMITTING DIODE DISPLAY DEVICE AND SILICON-BASED ORGANIC LIGHT-EMITTING DIODE DISPLAY METHOD

CROSS-REFERENCE TO RELATED APPLICATIONS

The present application is a U.S. National Phase Entry of International Application No. PCT/CN2020/081857 having an international filing date of Mar. 27, 2020. The above-identified application is incorporated into this application by reference in their entirety.

TECHNICAL FIELD

Embodiments of the present disclosure relate to, but are not limited to, the technical field of display, in particular to a display substrate, a display method, and a display device.

BACKGROUND

With the increasing progress of virtual reality/augmented reality (VR/AR) technology and the rapid growth of the market, display panels suitable for the VR/AR field are also developing in the direction of miniaturization, high Pixels Per Inch (PPI), fast response and high color gamut, and a silicon-based Organic Light-Emitting Diode (OLED) microdisplay panel is one of the prominent directions. Although silicon-based OLED microdisplay technology started late, it is becoming a new focus in the display field with its advantages of miniaturization and high PPI.

SUMMARY

The following is a summary of subject matter described in detail herein. This summary is not intended to limit the protection scope of the claims.

Embodiments of the present disclosure provide a display substrate including a display region and an offset region surrounding the display region. In a direction perpendicular to a plane of the display substrate, the display substrate includes a silicon-based substrate, an emitting structure layer arranged on the silicon-based substrate, and an encapsulation layer arranged on a side of the emitting structure layer far away from the silicon-based substrate. The silicon-based substrate in the display region is integrated with first pixel driving circuits, and the silicon-based substrate in the offset region is integrated with second pixel driving circuits. The first pixel driving circuits are connected with the emitting structure layer of the display region, and at least part of the first pixel driving circuits are configured to provide driving signals for the emitting structure layer electrically connected with the first pixel driving circuits during normal display. The second pixel driving circuits are connected with the emitting structure layer of the offset region, and at least part of the second pixel driving circuits are configured to provide no driving signals for the emitting structure layer electrically connected with the second pixel driving circuits during normal display.

In some possible implementations, all the first pixel driving circuits are configured to provide driving signals for the emitting structure layer electrically connected with the first pixel driving circuits.

In some possible implementations, the offset region includes a left offset region, a right offset region and/or an upper offset region and a lower offset region, wherein the difference between the number of pixel columns contained in the left offset region and the number of pixel columns contained in the right offset region does not exceed 10 rows, and the difference between the number of pixel rows contained in the upper offset region and the number of pixel rows contained in the lower offset region does not exceed 10 rows.

In some possible implementations, the left offset region and the right offset region contain the same number of pixel columns, and the upper offset region and the lower offset region contain the same number of pixel rows.

In some possible implementations, the ratio of the number of columns of pixel units in the left offset region or the right offset region to the number of columns of pixel units in the display region is greater than or equal to 1%; and the ratio of the number of rows of pixel units in the upper offset region or the lower offset region to the number of rows of pixel units in the display region is greater than or equal to 1%.

In some possible implementations, the display substrate further includes a color filter layer arranged on one side of the encapsulation layer away from the emitting structure layer, wherein color filter layer disposed in the display region and color filter layer disposed in the offset region each includes a first color unit, a second color unit and a third color unit arranged in an array.

In some possible implementations, the display substrate further includes a dummy pixel region at least partially surrounding the offset region. In the direction perpendicular to the plane of the display substrate, the dummy pixel region includes a silicon-based substrate, an emitting structure layer arranged on the silicon-based substrate, and an encapsulation layer arranged on a side of the emitting structure layer far away from the silicon-based substrate.

The embodiment of the present disclosure also provides a display device, which includes the display substrate as described in the previous item and further includes a gate driver, a source driver and a timing controller. The gate driver is configured to receive a gate control signal output by the timing controller, generate a scanning signal, transmit the scanning signal to an actual display region on the display substrate through a scanning line, and the actual display region is adjusted according to the position and number of bad dots of pixel units on the display substrate. The source driver is configured to receive data voltage and source control signals output by the timing controller, generate corresponding data voltage signals and output them to the actual display region on the display substrate through a data line. The timing controller is configured to receive red, green and blue data and timing control signals which are externally input; and generate data voltages and source control signals according to the red, green and blue data and timing control signals, output the data voltages and source control signals to the source driver, and generate gate driving signals and output the gate driving signals to the gate driver.

In some possible implementations, the actual display region being adjusted according to the position and number of the bad dots of the pixel units on the display substrate includes: in an initial display, driving, by the gate driver and the source driver, pixel units from row A to row B and column C to column D for display; driving, by the gate driver and the source driver, pixel units from row A to row B and column (C+N+1) to column (D+N+1) for display when pixel units from column C to column (C+N) near a left side edge of the display region include bad dots exceeding a second preset ratio; driving, by the gate driver and the source driver, pixel units from row A to row B and column (C−N−1) to column (D−N−1) for display when pixel units from column (D−N) to column D near a right side edge of the display region include bad dots exceeding a second preset ratio; driving, by the gate driver and the source driver, pixel units from row (A+M+1) to row (B+M+1) and column C to column D for display when pixel units from row A to row (A+M) near an upper side edge of the display region include bad dots exceeding a second preset ratio; and driving, by the gate driver and the source driver, pixel units from row (A−M−1) to row (B−M−1) and column C to column D for display when pixel units from row (B−M) to row B near a lower side edge of the display region include bad dots exceeding a second preset ratio; A, B, C, D, N, and M are all natural numbers greater than or equal to 1, and A<B, C<D, N<C, M<A.

The embodiment of the present disclosure also provides a display method, which includes: performing bad dot detection on multiple pixel units of a display region; and adjusting a pixel row output by a gate driver or a pixel column output by a source driver to move toward an opposite side of a side where a bad dot is located when a first preset number of pixel units near a side edge of the display region include bad dots exceeding a second preset ratio.

In some possible implementations, adjusting the pixel row output by the gate driver or the pixel column output by the source driver to move toward the opposite side of the side where the bad dot is located when the first preset number of the pixel units near the side edge of the display region includes the bad dots exceeding the second preset ratio includes: in an initial display, driving, by the gate driver and the source driver, pixel units from row A to row B and column C to column D for display; adjusting pixel columns output by the source driver to be column (C+N+1) to column (D+N+1) when pixel units from column C to column (C+N) near a left side edge of the display region include bad dots exceeding a second preset ratio; adjusting pixel columns output by the source driver to be column (C−N−1) to column (D−N−1) when pixel units from column (D−N) to column D near a right side edge of the display region include bad dots exceeding a second preset ratio; adjusting pixel rows output by the gate driver to be row (A+M+1) to row (B+M+1) when pixel units from row A to row (A+M) near an upper side edge of the display region include bad dots exceeding a second preset ratio; and adjusting pixel rows output by the gate driver to be row (A−M−1) to row (B−M−1) when pixel units from row (B−M) to row B near a lower side edge of the display region include bad dots exceeding a second preset ratio. A, B, C, D, N, and M are all natural numbers greater than or equal to 1, and A<B, C<D, N<C, M<A.

In some possible implementations, performing the bad dot detection on the multiple pixel units of the display region includes: arranging the multiple pixel units of the display region into groups; driving multiple groups to emit light in sequence; and when each group emits light, determining whether a group includes bad dots and the number of the bad dots included according to whether pixel units in the group emit light or not.

Other aspects will become apparent upon reading and understanding the brief description of the drawings and embodiments of the present disclosure.

Figure 1:
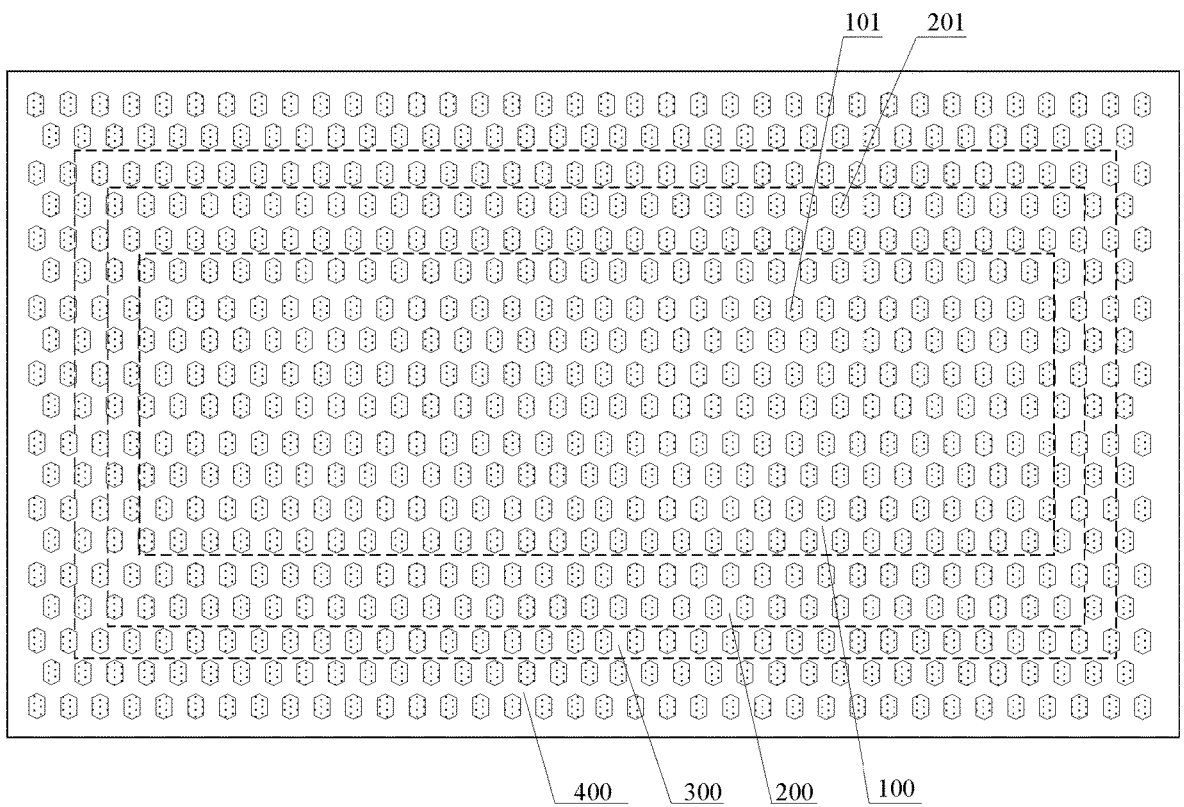
FIG. 1 is a schematic structural diagram of a display substrate of the present disclosure.

Description of the reference signs:

| | |
|---|---|
| 100-Display Region; | 200-Offset Region; |
| 300-Dummy Pixel Region; | 400-Cathode Ring; |
| 101-First Pixel Unit; | 102-Bad Dot; |
| 201-Second Pixel Unit; | 103-Pixel Driving Circuit; |
| 104-Emitting Device; | 110-Voltage Control Circuit; |
| 10-Silicon-Based Substrate; | 11-Driving Thin Film Transistor; |
| 12-First Insulating Layer; | 13-First Conductive Pillar; |
| 14-Reflective Electrode; | 15-Second Insulating Layer; |
| 16-Second Conductive Pillar; | 20-Emitting Structure Layer; |
| 31-Anode; | 32-Pixel Definition Layer; |
| 33-Organic Emitting Layer; | 34-Cathode; |
| 40-Encapsulation Layer, | 50-Color Filter Layer; |
| 53-First Color Unit; | 54-Second Color Unit; |
| 55-Third Color Unit; | 60-Protective Layer, |
| 70-Cover Panel; | 401-Power Supply Electrode; |
| 331-First Emitting Sublayer; | 332-First Charge Generating Layer; |
| 333-Second Emitting Sublayer; | 334-Second Charge Generating Layer; |
| 335-Third Emitting Sublayer; | 3311-First Hole Transporting Layer; |
| 3312-First Emitting Material Layer; | 3313-First Electron Transporting Layer; |
| 3331-Second Hole Transporting Layer; | 3332-Second Emitting Material Layer; |
| 3333-Second Electron Transporting Layer; | 3351-Third Hole Transporting Layer; |
| 3352-Third Emitting Material Layer; | 3353-Third Electron Transporting Layer. |

DETAILED DESCRIPTION

To make the objects, technical solutions and advantages of the present disclosure more clear, embodiments of the present disclosure will be described in detail below with reference to the accompanying drawings. The embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of constituent elements, or the thickness or region of a layer, is sometimes exaggerated for clarity. Therefore, an implementation of the present disclosure is not necessarily limited to the size shown, and the shape and size of components in the drawings do not reflect true proportions. In addition, the drawings schematically show ideal examples, and implementation of the present disclosure is not limited to the shapes or values shown in the drawings.

The "first", "second", "third" and other ordinal numbers in the present specification are used to avoid confusion of constituent elements, but not to limit in quantity.

In the present specification, for convenience, words and sentences indicating the position or positional relationship, such as "middle", "upper", "lower", "front", "rear", "vertical", "horizontal", "top", "bottom", "inner" and "outer", are used for indicating the positional relationship of constituent elements with reference to the drawings, only for facilitating the description of the present specification and simplifying the description. They do not indicate or imply that the pointed device or element must have a specific orientation, be configured and operated in a specific orientation, and therefore cannot be understood as a limitation of the present disclosure. The positional relationship of the constituent elements is appropriately changed according to the direction in which each constituent element is described. Therefore, it is not limited to the words and sentences described in the specification, and can be changed appropriately according to the situation.

In the specification, the terms "installed", "connected" and "coupled" shall be broadly understood unless otherwise explicitly specified and defined. For example, it may be fixed connection, removable connection, or integral connection; it may be mechanical connection or electrical connection; it may be direct connection, indirect connection through middleware, or internal connection between two elements. For those of ordinary skill in the art, the specific meanings of the above terms in the present disclosure may be understood according to a specific situation.

In the present specification, a transistor refers to an element including at least three terminals, namely a gate electrode, a drain electrode and a source electrode. A transistor has a channel region between a drain electrode (drain electrode terminal, drain region or drain electrode) and a source electrode (source electrode terminal, source region or source electrode), and current can flow through the drain electrode, channel region and source electrode. In the present specification, a channel region refers to a region through which current mainly flows.

In the present specification, it may be a first electrode as the drain electrode and a second electrode as the source electrode, or it may be the first electrode as the source electrode and the second electrode as the drain electrode. The functions of the "source electrode" and the "drain electrode" are sometimes interchanged when transistors with opposite polarities are used or when the current direction changes during circuit operation. Therefore, in the present specification, the "source electrode" and "drain electrode" can be interchanged.

In the present specification, "connection" includes the case where the constituent elements are connected together through elements having certain electrical effects. The "elements having a certain electrical effects" is not particularly limited as long as it can transmit and receive electrical signals between connected constituent elements. Examples of the "elements having certain electrical effects" include not only electrodes and wiring, but also switching elements such as transistors, resistors, inductors, capacitors, and other elements with various functions.

In the present specification, "parallel" refers to a state in which two straight lines form an angle of −10 degrees or more and 10 degrees or less, and thus also includes a state in which the angle is −5 degrees or more and 5 degrees or less. In addition, "vertical" refers to a state in which an angle of 80 degrees or more and 100 degrees or less is formed by two straight lines, and thus also includes a state in which an angle is 85 degrees or more and 95 degrees or less.

In the present specification, "film" and "layer" can be interchanged. For example, sometimes "conductive layer" can be replaced by "conductive film". Similarly, "insulating film" can sometimes be replaced by "insulating layer".

In the manufacturing process of silicon-based OLED microdisplay, packaging, pasting and other processes sometimes cause some pixels in the display region on one side of the display module to be damaged, which causes the actual display pixel points to be lower than the pre-designed pixel points when displaying.

At least one embodiment of the present disclosure provides a display substrate. The display substrate includes a display region and an offset region surrounding the display region. In a direction perpendicular to a plane of the display substrate, the display substrate includes a silicon-based substrate, an emitting structure layer arranged on the silicon-based substrate, and an encapsulation layer arranged on a side of the emitting structure layer far away from the silicon-based substrate. The silicon-based substrate in the display region is integrated with first pixel driving circuits, and the silicon-based substrate in the offset region is integrated with second pixel driving circuits. The first pixel driving circuits are connected with the emitting structure layer of the display region, and at least part of the first pixel driving circuits are configured to provide driving signals for the emitting structure layer electrically connected with the first pixel driving circuits during normal display. The second pixel driving circuits are connected with the emitting structure layer of the offset region, and at least part of the second pixel driving circuits are configured to provide no driving signals for the emitting structure layer electrically connected with the second pixel driving circuits during normal display.

Some embodiments of the present disclosure also provide a display device and a display method corresponding to the display substrate.

According to the display substrate provided by the above embodiments of the present disclosure, by setting the offset region, when some pixel units in the display region at a certain edge of the display module are damaged due to packaging, pasting and other processes, the position of the actual display region can be adjusted to move toward the offset region, so as to avoid the pixel units damaged by the packaging or pasting, so as to ensure that the number of actually displayed pixels is consistent with the number of pre-designed pixels.

FIG. 1 is a schematic diagram of a structure of a display substrate according to an embodiment of the present disclosure. As shown in FIG. 1, in this embodiment, the display substrate includes a display region 100 and an offset region 200 surrounding the display region 100. In a direction perpendicular to a plane of the display substrate, the display substrate includes a silicon-based substrate, an emitting structure layer arranged on the silicon-based substrate, and an encapsulation layer arranged on a side of the emitting structure layer far away from the silicon-based substrate. The silicon-based substrate in the display region is integrated with first pixel driving circuits, and the silicon-based substrate in the offset region is integrated with second pixel driving circuits. The first pixel driving circuits are connected with the emitting structure layer of the display region, and at least part of the first pixel driving circuits are configured to provide driving signals for the emitting structure layer electrically connected with the first pixel driving circuits during normal display. The second pixel driving circuits are connected with the emitting structure layer of the offset region, and at least part of the second pixel driving circuits are configured to provide no driving signals for the emitting structure layer electrically connected with the second pixel driving circuits during normal display.

In an exemplary embodiment, all the first pixel driving circuits are configured to provide driving signals for the emitting structure layer electrically connected with the first pixel driving circuits.

In an exemplary embodiment, as shown in FIG. 1, the display substrate may further include a dummy pixel region 300 at least partially surrounding the offset region 200. In the direction perpendicular to the plane of the display substrate, the dummy pixel region 300 may include a silicon-based substrate, an emitting structure layer arranged on the silicon-based substrate, and an encapsulation layer arranged on a side of the emitting structure layer far away from the silicon-based substrate.

In an exemplary embodiment, as shown in FIG. 1, the display substrate may further include a cathode ring 400 surrounding the dummy pixel region 300. In the direction perpendicular to the plane of the display substrate, the cathode ring 400 may include a power supply electrode layer arranged on the silicon-based substrate, a reflective layer arranged on a side of the power supply electrode layer far away from the silicon-based substrate, an anode layer arranged on a side of the reflective layer far away from the power supply electrode layer, and a cathode layer arranged on a side of the anode layer far away from the reflective layer.

In an exemplary embodiment, as shown in FIG. 1, the display region 100 includes multiple first pixel units 101, and the offset region 200 includes multiple second pixel units 201. The second pixel units 201 are configured as spare pixel units of the first pixel units 101.

In an exemplary embodiment, the display substrate can be a silicon-based OLED microdisplay substrate or any other type of display substrate. The silicon-based OLED microdisplay substrate uses monocrystalline silicon wafer as an active driving backplane, which has excellent characteristics such as high PPI, high integration, small size, easy portability, good seismic performance and ultra-low power consumption.

In an exemplary embodiment, the offset region 200 may include any one or more of the following: a left offset region, a right offset region, an upper offset region and a lower offset region. The difference between the number of pixel columns contained in the left offset region and the number of pixel columns contained in the right offset region does not exceed 10 rows, and the difference between the number of pixel rows contained in the upper offset region and the number of pixel rows contained in the lower offset region does not exceed 10 rows.

In an exemplary embodiment, the left offset region and the right offset region may contain the same number of pixel columns.

Figure 2:
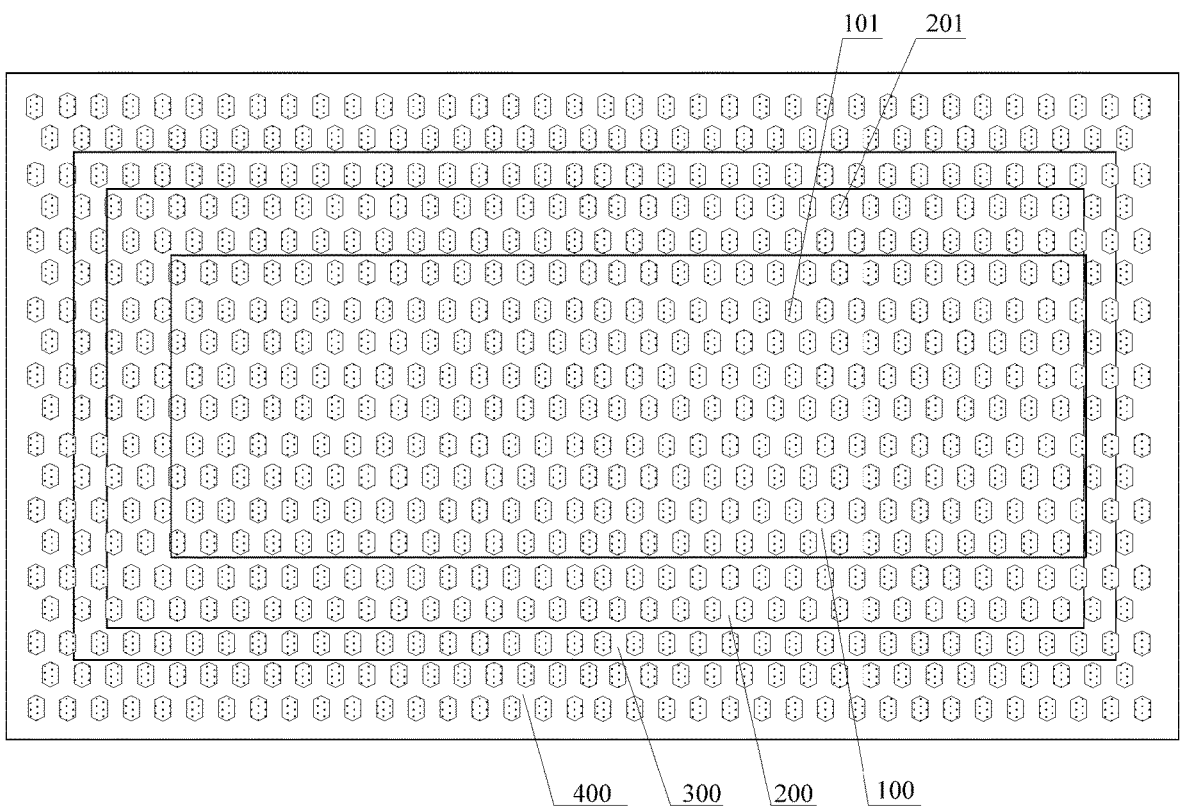
FIG. 2 is a schematic diagram of an actual display region moving to the right when a pixel at a left side edge of the display substrate in FIG. 1 is damaged.

As shown in FIG. 2, when first pixel units 101 near a left side edge of the display region 100 include bad dots 102 exceeding a second preset ratio, pixel columns output by the source driver are adjusted to move to the right, that is, the actual display region moves to the right. Similarly, when first pixel units 101 near a right side edge of the display region 100 include bad dots 102 exceeding a second preset ratio, pixel columns output by the source driver are adjusted to move to the left, that is, the actual display region moves to the left.

In an exemplary embodiment, the ratio of the number of columns of second pixel units in the left offset region to the number of columns of first pixel units in the display region is greater than or equal to 1%; the ratio of the number of columns of second pixel units in the right offset region to the number of columns of first pixel units in the display region is greater than or equal to 1%; Exemplarily, when the display region includes 1920 rows*1080 columns of first pixel units, the left offset region includes 0 column to 16 columns of second pixel units, and the right offset region includes 0 column to 16 columns of second pixel units. By setting a reasonable number of second pixel units, the actual display space of the display substrate is not wasted, and a certain alternative display space is reserved for use when the edge of the first pixel units in the preset display region is damaged.

In an exemplary embodiment, the upper offset region and the lower offset region may contain the same number of pixel rows.

Figure 3:
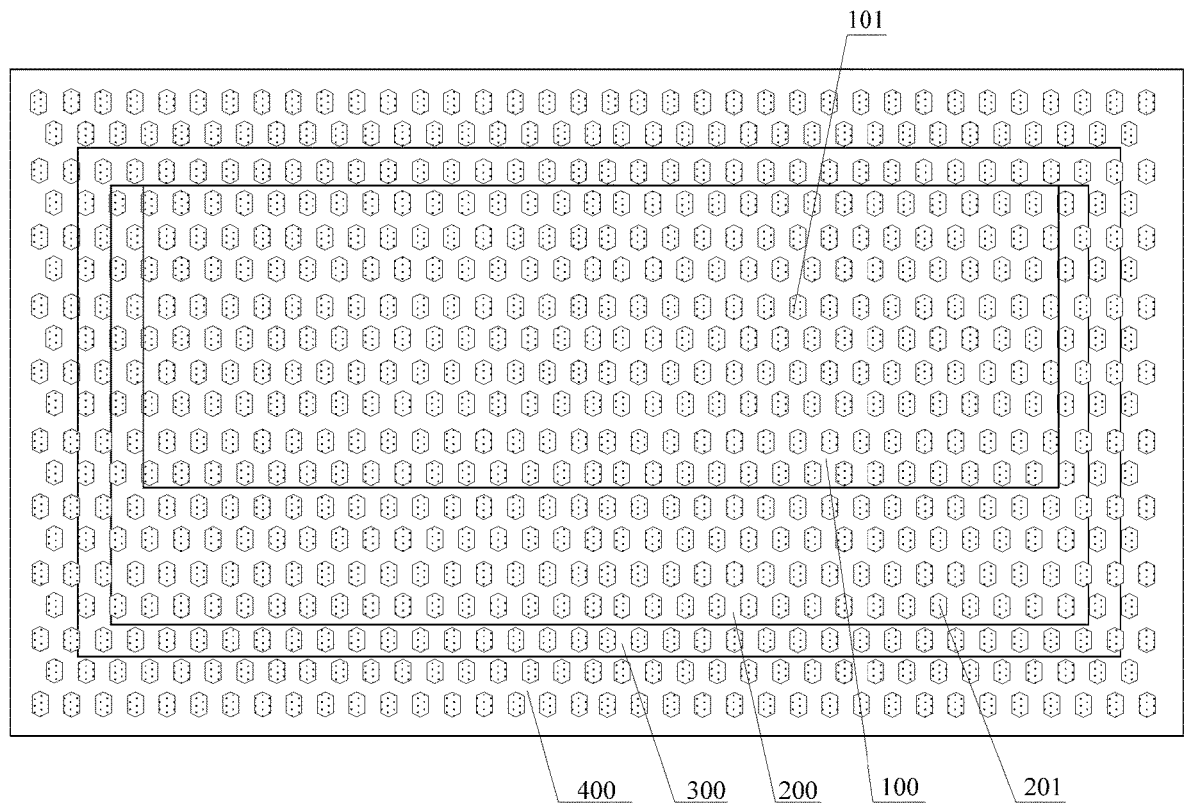
FIG. 3 is a schematic diagram of an actual display region moving up when a pixel at a lower side edge of the display substrate in FIG. 1 is damaged.

As shown in FIG. 3, when first pixel units 101 near a lower side edge of the display region 100 include bad dots 102 exceeding a second preset ratio, pixel rows output by the gate driver are adjusted to move upward, that is, the actual display region moves up. Similarly, when first pixel units 101 near an upper side edge of the display region 100 include bad dots 102 exceeding a second preset ratio, pixel rows output by the gate driver are adjusted to move downward, that is, the actual display region moves down.

In an exemplary embodiment, the ratio of the number of rows of second pixel units in the upper offset region to the number of rows of first pixel units in the display region is greater than or equal to 1%; the ratio of the number of rows of second pixel units in the lower offset region to the number of rows of first pixel units in the display region is greater than or equal to 1%. Exemplarily, when the display region includes 1920 rows*1080 columns of first pixel units, the upper offset region includes 0 row to 16 rows of second pixel units, and the lower offset region includes 0 row to 16 rows of second pixel units. By setting a reasonable number of second pixel units, the actual display space of the display substrate is not wasted, and a certain alternative display space is reserved for use when the edge of the first pixel units in the preset display region is damaged.

Figure 4:
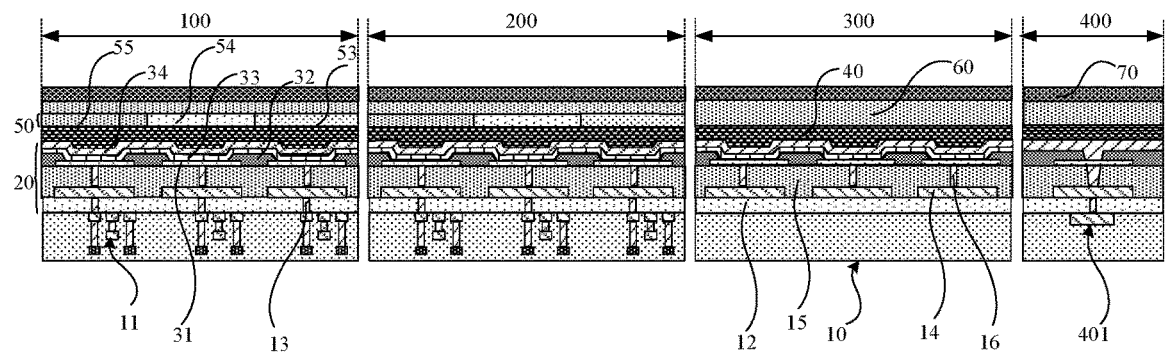
FIG. 4 is a schematic cross-sectional view of a display substrate of the present disclosure.

In this embodiment, as shown in FIG. 4, in a plane perpendicular to the display substrate, the display region 100 and the offset region 200 of the display substrate each include a silicon-based substrate 10, an emitting structure layer 20 arranged on the silicon-based substrate 10, an encapsulation layer 40 arranged on the emitting structure layer 20, and a color filter layer 50 arranged on the encapsulation layer 40. The silicon substrate 10 of the display region 100 and the offset region 200 of the display substrate is integrated with pixel driving circuits for generating driving signals, gate driving circuits for generating gate driving signals and data driving circuits for generating data signals. The emitting structure layer 20 includes a reflective layer, an anode layer, an organic emitting layer and a cathode layer stacked on the silicon-based substrate 10. The reflective layer is used for forming a micro-cavity structure with the cathode layer, so that the light directly emitted by the organic emitting layer and the light reflected by the reflective layer interfere with each other, thereby improving the color gamut of the emitted light and enhancing the brightness of the emitted light. In an exemplary embodiment, the emitting structure layer 20 may also include a structure film layer such as a pixel definition layer or a flat layer. Encapsulating the emitting structure layer 20 with the encapsulation layer 40 means that the encapsulation layer 40 is arranged on the upper surface of the emitting structure layer 20 on a side far away from the silicon-based substrate 10 and on all side surfaces of the emitting structure layer 20, so that the encapsulation layer 40 and the silicon-based substrate 10 form a sealed cavity in which the emitting structure layer 20 is arranged. In planes parallel to and perpendicular to the silicon-based substrate 10, an orthographic projection of the encapsulation layer 40 on the silicon-based substrate 10 includes an orthographic projection of the emitting structure layer 20 on the silicon-based substrate 10.

In an exemplary embodiment, color filter layers 50 of the display region 100 and the offset region 200 each include a first color unit 53, a second color unit 54 and a third color unit 55 arranged in an array, wherein the first color unit 53, the second color unit 54 and the third color unit 55 each can be one of a red (R) color filter (CF), a green (G) color filter and a blue (B) color filter. In some possible implementations, the color units in the color filter layer 50 may overlap each other as a black matrix, or a black matrix may be arranged between the color units. According to the present disclosure, a mode in the combination of a white OLED and a color filter may be used for realizing a high display resolution of more than 2000 and meeting the requirements of VR/AR.

In an exemplary embodiment, at least one layer of the organic emitting layer 33 may be arranged on the whole surface or separately according to each pixel region, so that the emitting layers of different colors in each pixel region can be stacked to emit white light.

In an exemplary embodiment, the organic emitting layer 33 may also be red, green and blue emitting layers arranged in an array respectively, and each pixel region emits red light, blue light and green light separately.

In an exemplary embodiment, the dummy pixel region 300 does not include a color filter structure. When, for example, the display unit in the offset region 200 on a side of the substrate is not used, the color filter layer above the display unit in the offset region 200 can be used as a dummy color filter to balance the uneven problem caused by uneven exposure and development when the color filter layer is manufactured.

In an exemplary embodiment, the dummy pixel region 300 may include a color filter structure. It can be arranged in the same way as the color filter layer in the display region, which is not repeated in the embodiment.

In an exemplary embodiment, a color filter layer may be arranged above the cathode ring 400, and the color filter layer in this region may extend to the peripheral region.

In an exemplary embodiment, the display substrate may further include a cover panel 70, the cover panel 70 is arranged above the color filter layer 50 so as to realize the function of protecting the color filter 50. In an exemplary embodiment, the cover panel 70 is connected with the silicon-based substrate 10 through a sealant. The sealant is arranged between the silicon-based substrate 10 and the cover panel 70, which can provide further protection against moisture and oxygen intrusion and greatly prolong the service life of the silicon-based OLED display substrate. In another exemplary embodiment, the sealant may be arranged on a side of the cover panel 70, and the peripheral sides of the cover panel 70 and the silicon-based substrate 10 are sealed by sealant, and the end face of a side of the sealant far away from the silicon-based substrate 10 is located between a surface of a side of the cover panel 70 adjacent to the silicon-based substrate 10 and a surface of a side of the cover panel 70 far away from the silicon-based substrate 10. This not only ensures the sealing effect, but also prevents the sealant from being higher than the cover panel 70 and causing the thickness of the display substrate to increase. In an exemplary embodiment, the cover panel 70 is arranged in the display region 100, which can better realize alignment and sealing, and avoid cracking of the cover panel 70 in the cutting process.

In an exemplary embodiment, the display substrate may further include a protective layer 60. The protective layer 60 is arranged between the color filter layer 50 and the cover panel 70, and the protective layer 60 covers the color filter layer 50. In an exemplary embodiment, SiC or SiCNx may be adopted to be the protective layer 60. Since SiC or SiCNx tends to have inorganic characteristics, on the one hand, it can protect the color filter layer 50, reduce the aging damage of the color filter layer 50, and prolong the service life, on the other hand, it can form a flat surface, which is convenient for leveling the glue material in the subsequent process of attaching the cover panel and improves the attaching quality of the cover panel.

Figure 5:
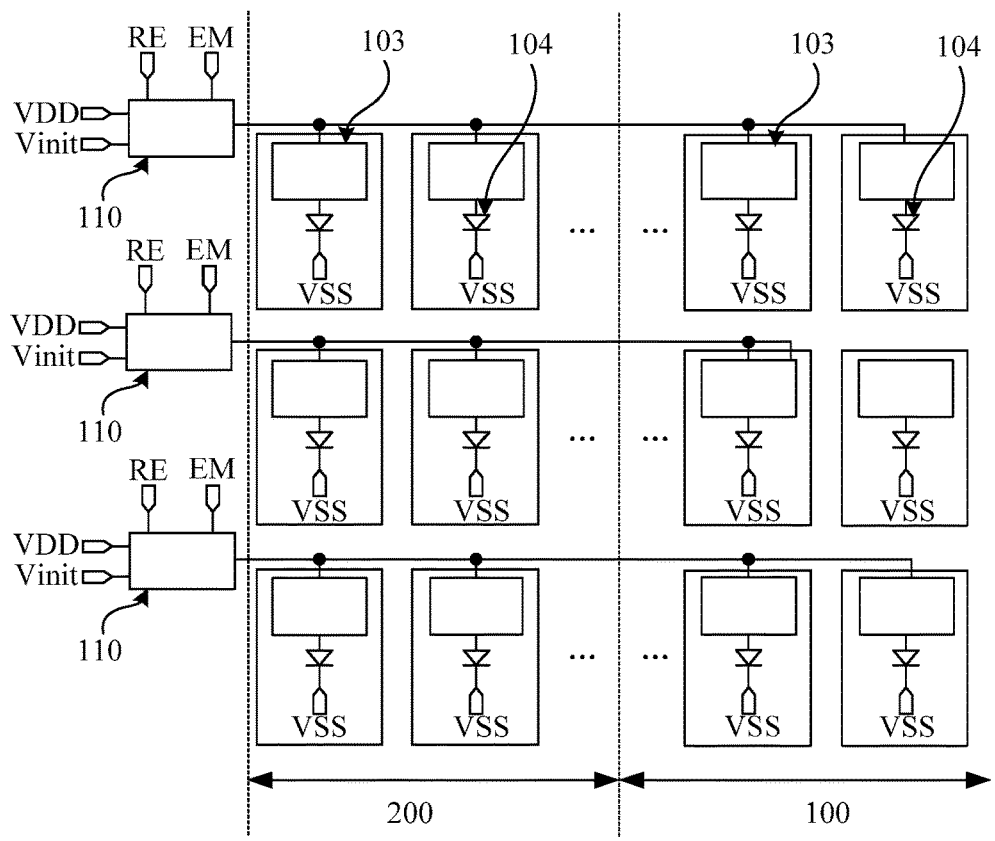
FIG. 5 is a schematic diagram of a circuit principle of a silicon-based substrate of the present disclosure.

FIG. 5 is a schematic diagram of a circuit principle of a silicon-based substrate of the present disclosure. The silicon-based substrate 10 includes multiple display units located in the display region 100 (AA region) and the offset region 200 and control circuits located in a peripheral region. The display units in the display region 100 are regularly arranged to form multiple display rows and multiple display columns. Each display unit includes a pixel driving circuit 103 and an emitting device 104 connected with the pixel driving circuit 103. The pixel driving circuit 103 at least includes a driving transistor. The control circuit at least includes multiple voltage control circuits 110, each voltage control circuit 110 is connected with multiple pixel driving circuits 103. For example, a voltage control circuit 110 is connected to a pixel driving circuit 103 in a display row. In the pixel driving circuit 103 of the display row, first electrodes of driving transistors are commonly connected to the voltage control circuit 110, a second electrode of each driving transistor is connected to an anode of an emitting device 104 of the display unit, and a cathode of the emitting device 104 is connected to an input end of a second power supply signal VSS. The voltage control circuits 110 are connected with an input end of a first power supply signal VDD, an input end of an initialization signal Vinit, an input end of a reset control signal RE and an input end of an emitting control signal EM, respectively. The voltage control circuits 110 are configured to output initialization signals Vinit to first electrodes of driving transistors in response to reset control signals RE to control corresponding emitting devices 104 to reset. Or the voltage control circuits 110 are configured to output first power supply signals VDD to first electrodes of driving transistors in response to emitting control signals EM to drive emitting devices 104 to emit light. By commonly connecting the pixel driving circuits 103 in one display row with the voltage control circuit 110, the structure of each pixel driving circuit 103 in the display region 100 can be simplified, and the occupied area of the pixel driving circuits 103 in the display region 100 can be reduced, so that more pixel driving circuits 103 and emitting devices 104 can be arranged in the display region 100, thus achieving high PPI display. The voltage control circuit 110 outputs the initialization signal Vinit to the first electrode of the driving transistor under the control of the reset control signal RE, and controls the corresponding emitting device 104 to reset, which can avoid the influence of the voltage applied to the emitting device 104 on the emitting of the next frame during the emitting of the previous frame and improve the afterimage phenomenon.

In an exemplary embodiment, three display units of different colors constitute one pixel unit (which may be the first pixel unit or the second pixel unit), and the three display units may be red display unit, green display unit and blue display unit respectively. In some possible implementations, one pixel unit can include four, five or more display units, which can be designed and determined according to the actual application environment, and is not limited here. In some possible implementations, one voltage control circuit 110 may be connected to the pixel driving circuits 103 in two adjacent display units in the same display row, or may be connected to the pixel driving circuits 103 in three or more display units in the same display row, which is not limited here.

Figure 6:
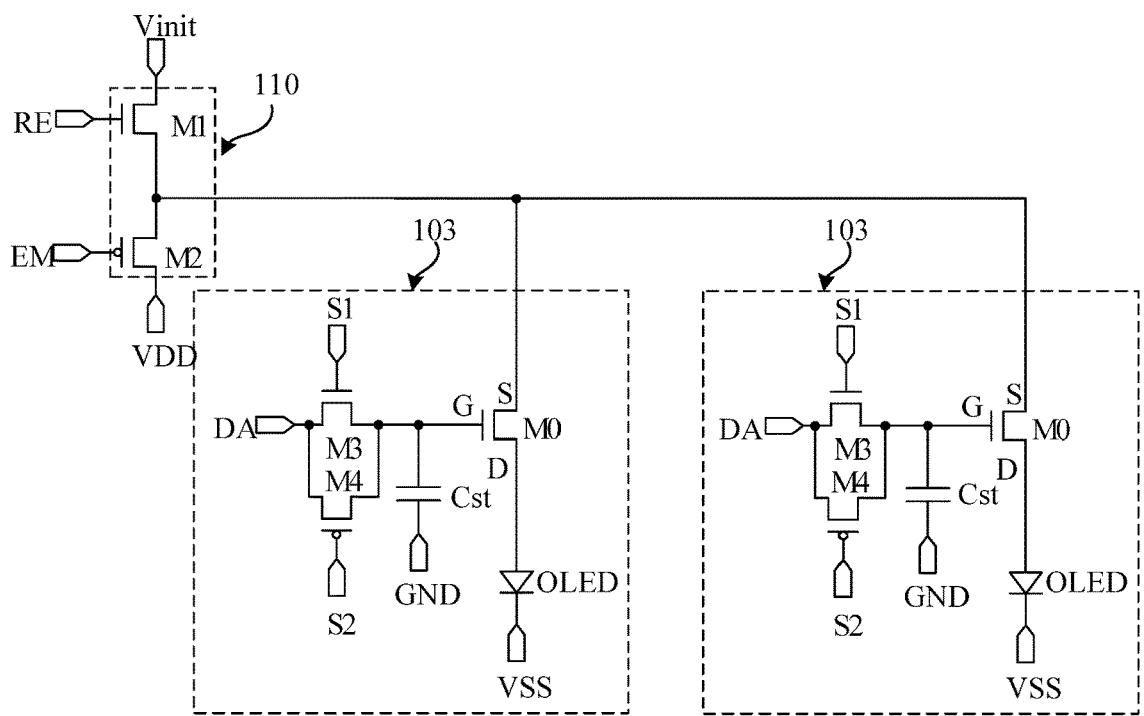
FIG. 6 is a schematic diagram of a circuit implementation of a voltage control circuit and a pixel driving circuit of the present disclosure.

FIG. 6 is a schematic diagram of a circuit implementation of a voltage control circuit and a pixel driving circuit of the present disclosure. As shown in FIG. 6, the emitting device may include an OLED, an anode of the OLED is connected to a second electrode D of a driving transistor M0, and a cathode of the OLED is connected to an input end of a second power supply signal VSS, the voltage of the second power supply signal VSS is generally negative voltage or ground voltage $V_{GND}$ (generally 0 V), and voltage of an initialization signal Vinit may also be set to ground voltage $V_{GND}$. In an exemplary embodiment, the OLED may be a Micro-OLED or a Mini-OLED, which is beneficial to achieve high PPI display.

In an exemplary embodiment, the voltage control circuit 110 is connected with two pixel driving circuits 103 in a display row, the pixel driving circuit 103 includes a driving transistor M0, a third transistor M3, a fourth transistor M4 and a storage capacitor Cst, and the voltage control circuit 110 includes a first transistor M1 and a second transistor M2. A driving transistor M0, a first transistor M1, a second transistor M2, a third transistor M3 and a fourth transistor M4 are all metal oxide semiconductors (MOS) fabricated in a silicon-based substrate.

The first transistor M1 has a control electrode connected to an input end of a reset control signal RE for receiving the reset control signal RE, a first electrode of the first transistor M1 is connected to an input end of an initialization signal Vinit for receiving the initialization signal Vinit, and a second electrode of the first transistor M1 is connected to a first electrode S of a corresponding driving transistor M0 and a second electrode of a second transistor M2 respectively. The second transistor M2 has a control electrode connected to an input end of an emitting control signal EM for receiving the emitting control signal EM. A first electrode of the second transistor M2 is connected to an input end of a first power supply signal VDD for receiving the first power supply signal VDD, and a second electrode of the second transistor M2 is connected to a first electrode S of a corresponding driving transistor M0 and a second electrode of a first transistor M1 respectively. In an exemplary embodiment, the types of the first transistor M1 and the second transistor M2 may be different, for example, the first transistor M1 is an n-type transistor and the second transistor M2 is a p-type transistor, or the first transistor M1 is a p-type transistor and the second transistor M2 is an n-type transistor. In some possible implementations, the types of the first transistor M1 and the second transistor M2 can be the same, and can be designed and determined according to the actual application environment, which is not limited here.

The pixel driving circuit 103 includes a driving transistor M0, a third transistor M3, a fourth transistor M4 and a storage capacitor Cst. A control electrode G of the driving transistor M0, a first electrode S of the driving transistor M0 are connected to a second electrode of the first transistor M1 and a second electrode of the second transistor M2, and a second electrode D of the driving transistor M0 is connected to an anode of the OLED. The third transistor M3 has a control electrode connected to an input end of a first control electrode scan signal S1 for receiving the first control electrode scan signal S1, a first electrode of the third transistor M3 is connected to an input end of a data signal DA for receiving the data signal DA, and a second electrode of a third transistor M3 is connected to a control electrode G of the driving transistor M0. The fourth transistor M4 has a control electrode connected to an input end of a second control electrode scan signal S2 for receiving the second control electrode scan signal S2, a first electrode of the fourth transistor M4 is connected to an input end of a data signal DA for receiving the data signal DA, and a second electrode of a fourth transistor M4 is connected to a control electrode G of the driving transistor M0. A first end of the storage capacitor Cst is connected to a control electrode G of the driving transistor M0, and a second end of the storage capacitor Cst is connected to the ground terminal GND. In an exemplary embodiment, the driving transistor M0 may be an N-type transistor, and the types of the third transistor M3 and the fourth transistor M4 may be different, for example, the third transistor M3 is an N-type transistor and the fourth transistor M4 is a P-type transistor. When the voltage of the data signal DA is the voltage corresponding to a high gray scale, the voltage of the data signal DA can be prevented from being affected by the threshold voltage of the third transistor M3 of the N type for example, by turning on the fourth transistor M4 of the P type to transmit the data signal DA to the control electrode G of the driving transistor M0. When the voltage of the data signal DA is the voltage corresponding to a low gray scale, the voltage of the data signal DA can be prevented from being affected by the threshold voltage of the fourth transistor M4 of the P-type by turning on the third transistor M3 of the N-type to transmit the data signal DA to the control electrode G of the driving transistor M0. In this way, the range of the voltage input to the control electrode of the driving transistor M0 can be increased. In some possible implementations, the types of the third transistor M3 and the fourth transistor M4 may be that: the third transistor M3 is a P-type transistor and the fourth transistor M4 is an N-type transistor. In some possible implementations, the pixel driving circuit may be a 3T1C, 5T1C or 7T1C circuit structure, or may be a circuit structure with internal compensation or external compensation function, which is not limited by the present disclosure.

The structure of the display substrate is described below through an example of a preparation process of the display substrate. The "patterning process" mentioned in the present disclosure includes processes, such as film layer deposition, photoresist coating, mask exposure, development, etching, and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Thin film" refers to a layer of thin film formed from a certain material on a substrate through a depositing or coating process. If the "thin film" does not need a patterning process during the whole manufacturing process, the "thin film" can also be called a "layer". If the "thin film" needs a patterning process throughout the whole manufacturing process, it is referred to as a "thin film" before the patterning process and as a "layer" after the patterning process. The "layer" after the patterning process contains at least one "pattern". In the present disclosure, "A and B are arranged on the same layer" means that A and B are formed at the same time by the same patterning process. In the present disclosure, "the orthographic projection of A includes the orthographic projection of B" means that the orthographic projection of B falls within the range of the orthographic projection of A, or the orthographic projection of A covers the orthographic projection of B.

Figure 7:
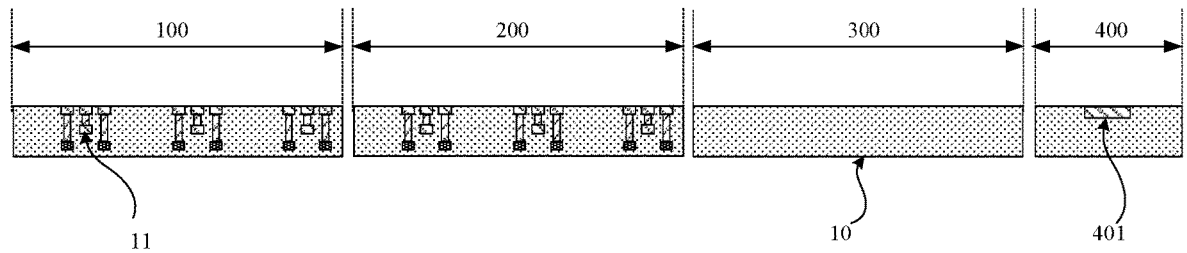
FIG. 7 is a schematic diagram of a display substrate of the present disclosure after a silicon-based substrate is prepared.

(1) A silicon-based substrate 10 is prepared. The silicon-based substrate 10 includes a display region 100 and a peripheral region surrounding the display region 100, the peripheral region includes an offset region 200, a dummy pixel region 300, and a cathode ring 400, silicon-based substrates 10 of the display region 100 and the offset region 200 are all integrated with pixel driving circuits, and a silicon-based substrate 10 of the cathode ring 400 is integrated with a power supply circuit, as shown in FIG. 7. As an exemplary illustration, FIG. 7 illustrates three display units in the display region 100: a first preferred display unit, a second preferred display unit and a third preferred display unit. FIG. 7 illustrates three display units in the offset area 200: the first alternative display unit, the second alternative display unit and the third alternative display unit. FIG. 7 illustrates a driving transistor 11 included in the pixel driving circuit and a power supply electrode 401 of the cathode ring 400. In an exemplary embodiment, the driving thin film transistors of the display region 100 and the offset region 200 each include an active layer, a gate electrode, a source electrode, a drain electrode and a gate connection electrode, the source electrode and the drain electrode are connected with the active layer through conductive pillars, and the gate connection electrode is connected with the gate electrode through conductive pillars. Mature CMOS integrated circuit technology can be used to prepare the silicon-based substrate 10, which is not limited by the present disclosure. After preparation, the surface of the silicon-based substrate 10 exposes the source electrode, drain electrode and gate connection electrode of the display region 100, the source electrode, drain electrode and gate connection electrode of the offset region 200, and the power supply electrode 401 of the cathode ring 400.

Figure 8:
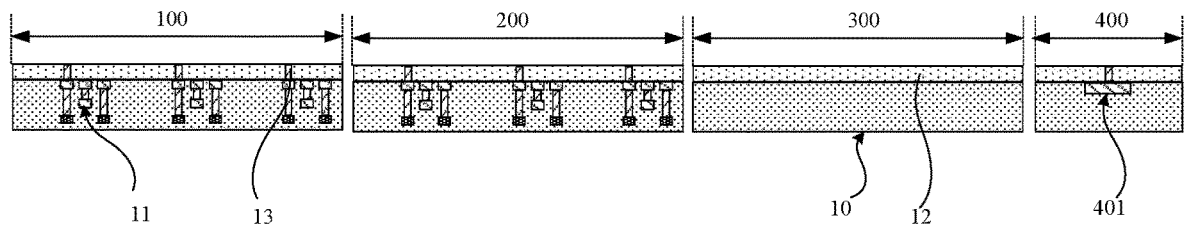
FIG. 8 is a schematic diagram of a display substrate of the present disclosure after a first insulating layer and a first conductive pillar are formed.

(2) A first insulating film is deposited on the silicon-based substrate 10, and the first insulating film is patterned by a patterning process to form a pattern of a first insulating layer 12 covering the silicon-based substrate 10. The first insulating layer 12 of the display region 100 and the offset region 200 each forms multiple first vias, the first insulating layer 12 of the cathode ring 400 forms at least one second via, the multiple first vias each exposes a drain electrode of each display unit, and the second via exposes the power supply electrode 301. Then, multiple first conductive pillars 13 are formed in the first vias and the second via on the first insulating layer 12, the first conductive pillar 13 in the first vias are connected with the drain electrode of the display unit in which the first conductive pillar 13 is located, and the first conductive pillar 13 in the second via is connected with the power supply electrode 401 of the cathode ring 400, as shown in FIG. 8. In an exemplary embodiment, the first conductive pillar 13 may be made of metal material, and polishing treatment may also be carried out after the first conductive pillar 13 is formed by filling treatment. Surfaces of the first insulating layer 12 and the first conductive pillar 13 are corroded and rubbed by polishing process, and partial thickness of the first insulating layer 12 and the first conductive pillar 13 is removed, so that the first insulating layer 12 and the first conductive pillar 13 form a flush surface. In some possible implementations, the first conductive pillar 13 may be made of metal tungsten (W), and the via filled with tungsten metal is called tungsten via (W-via). When the thickness of the first insulating layer 12 is large, the stability of the conductive path can be ensured by using the tungsten via. Due to the mature process of manufacturing the tungsten via, the surface flatness of the obtained first insulating layer 12 is good, which helps reducing contact resistance. The tungsten via is not only suitable for the connection between the silicon-based substrate 10 and the reflective layer, but also for the connection between the reflective layer and the anode layer, and the connection between other wiring layers.

Figure 9:
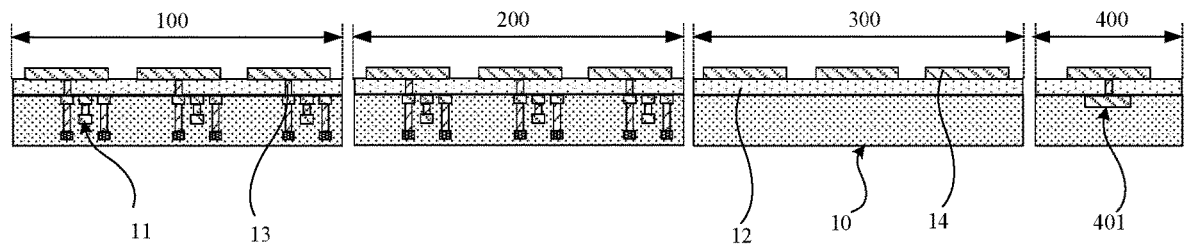
FIG. 9 is a schematic diagram of a display substrate of the present disclosure after a reflective electrode is formed.

(3) A first metal film is deposited on the silicon-based substrate 10 forming the aforementioned structure, and the first metal film is patterned by a patterning process to form a pattern of a reflective layer on the first insulating layer 12. The reflective layer includes multiple reflective electrodes 14 arranged in the display region 100, the offset region 200, the dummy pixel region 300 and the cathode ring 400. In each display unit, the reflective electrode 14 is connected to the drain electrode through the first conductive pillar 13, and in the cathode ring 400, the reflective electrode 14 is connected to the power supply electrode 401 through the first conductive pillar 13, as shown in FIG. 9. In an exemplary embodiment, the reflective electrode 14 of each display unit is used to form a microcavity structure with a cathode formed later. Using the strong reflection effect of the reflective electrode, the light directly emitted by the organic emitting layer and the light reflected by the reflective electrode interfere with each other, thereby increasing the color gamut of the emitted light and enhancing the brightness of the emitted light.

Figure 10:
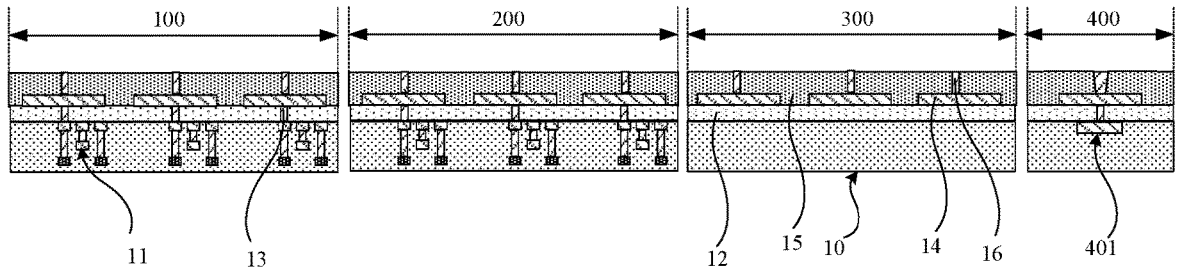
FIG. 10 is a schematic diagram of a display substrate of the present disclosure after a second insulating layer and a second conductive pillar are formed.

(4) A second insulating film is deposited on the silicon-based substrate 10 forming the aforementioned structure, and the second insulating film is patterned by a patterning process to form a pattern of a second insulating layer 15 covering the silicon-based substrate 10. The second insulating layer 15 of the display region 100 and the offset region 200 each forms multiple third via holes, the second insulating layer 15 of the dummy pixel area 300 forms multiple fourth via holes, and the second insulating layer 15 of the cathode ring 400 forms at least one fifth via. Multiple third via holes each exposes the reflective electrode 14 of each display unit, multiple fourth via holes each exposes the reflective electrode 14 of each dummy pixel area 300, and the fifth via exposes the reflective electrode 14 of the cathode ring 400. Then, multiple second conductive pillars 16 are formed in the third, fourth and fifth vias on the second insulating layer 15. The second conductive pillar 16 in the third via is connected with the reflective electrode 14 of the display unit in which the second conductive pillar 16 is located, the second conductive pillar 16 in the fourth via is connected with the reflective electrode 14 of the dummy pixel region 300, and the second conductive pillar 16 in the fifth via is connected with the reflective electrode 14 of the cathode ring 400, as shown in FIG. 10. In an exemplary embodiment, the second conductive pillar 16 may be made of metal material, and polishing treatment may also be carried out after the second conductive pillar 16 is formed by filling treatment. Surfaces of the second insulating layer 15 and the second conductive pillar 16 are corroded and rubbed by polishing process, and partial thickness of the second insulating layer 15 and the second conductive pillar 16 is removed, so that the second insulating layer 15 and the second conductive pillar 16 form a flush surface. In some possible implementations, metal tungsten (W) may be used as the second conductive pillar 16.

Figure 11:
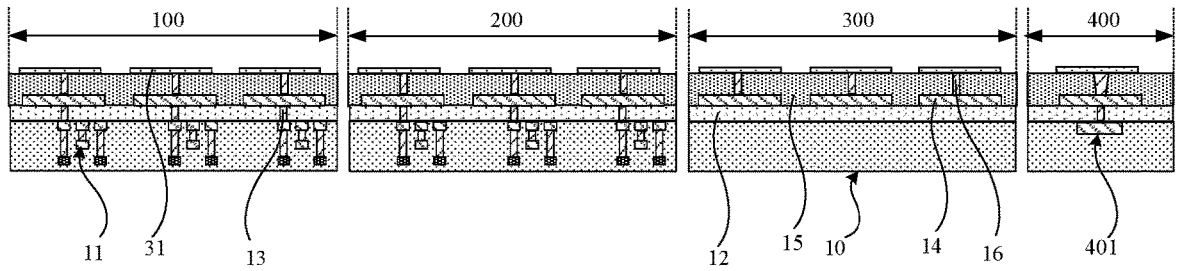
FIG. 11 is a schematic diagram of a display substrate of the present disclosure after an anode layer is formed.

(5) A transparent conductive film is deposited on the silicon-based substrate 10 forming the foregoing structure, and the transparent conductive film is patterned by a patterning process. A pattern of an anode layer is formed on the second insulating layer 15 of each of the display area 100, the offset area 200, the dummy pixel area 300 and the cathode ring 400. The anode layer includes multiple anodes 31 arranged in the display area 100, the offset area 200, the dummy pixel area 300 and the cathode ring 400, and the anode 31 is connected to the reflective electrode 14 through the second conductive pillar 16, as shown in FIG. 11. In the present disclosure, the anode 31 is connected to the reflective electrode 14 through the second conductive pillar 16, and the reflective electrode 14 is connected to the drain electrode of the driving thin film transistor 11 through the first conductive pillar 13. In this way, the electrical signal provided by the pixel driving circuit is transmitted to the anode 31 through the reflective electrode 14. The reflective electrode 14 forms a conductive channel between the pixel driving circuit and the anode on the one hand, and forms a microcavity structure on the other hand. This not only facilitates the control of the emitting device by the pixel driving circuit, but also makes the structure of the display substrate more compact, which is beneficial to the miniaturization of the silicon-based OLED display device.

Figure 12:
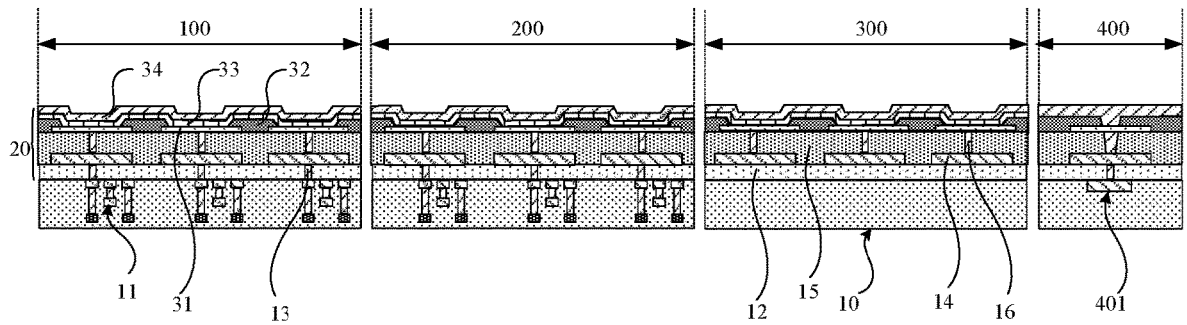
FIG. 12 is a schematic diagram of a display substrate of the present disclosure after an organic emitting layer and a cathode are formed.

(6) A pixel definition film is coated on the silicon base substrate 10 forming the aforementioned structure. Through masking, exposure, and development processes, a pattern of a pixel definition layer (PDL) 32 is formed in the display area 100, the offset area 200, the dummy pixel area 300, and the cathode ring 400. In each display unit, the pixel definition layer 32 is provided with a pixel opening, and the pixel opening exposes the surface of the anode 31. Then, an organic emitting layer 33 and a cathode 34 are sequentially formed in the display region 100, the offset region 200 and the dummy pixel region 300. In each display unit, the organic emitting layer 33 is connected with the anode 31 of the display unit, and the planar cathode 34 is connected with the organic emitting layer 33 of each display unit. A cathode 34 is formed on the cathode ring 400, and the cathode 34 of the cathode ring 400 is connected with the anode 31 through the pixel opening, as shown in FIG. 12. In an exemplary embodiment, the cathode 34 is a semi-transparent and semi-reflective electrode, and constitutes a microcavity structure with the reflective electrode 14 formed as described above.

In the aforementioned preparation process, the first insulating film and the second insulating film may be made of silicon oxide (SiOx), silicon nitride (SiNx) or silicon oxynitride (SiON), and may have a single-layer structure or a multi-layer composite structure. The first metal thin film may be made of a metal material, such as silver (Ag), copper (Cu), aluminum (Al), molybdenum (Mo), or the like, or made of an alloy material composed of the above metals, such as aluminum niobium alloy (AlNd) or molybdenum niobium alloy (MoNb), or the like. The alloy material may have a single-layer structure or a multi-layer composite structure, such as a Mo/Cu/Mo composite structure. The transparent conductive film can be made of indium tin oxide (ITO) or indium zinc oxide (IZO), or a composite structure of ITO/Ag/ITO, and the pixel definition layer can be made of polyimide, acrylic or polyethylene terephthalate, etc.

Figure 13:
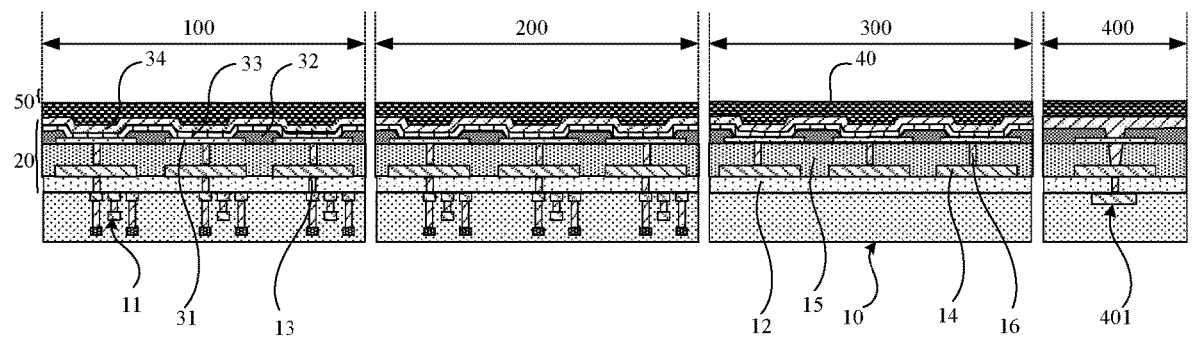
FIG. 13 is a schematic diagram of a display substrate of the present disclosure after an encapsulation layer is formed.

(7) On the silicon substrate 10 forming the aforementioned structure, an encapsulation layer pattern is formed in the display region 100, the offset region 200, the dummy pixel region 300 and the cathode ring 400, and the encapsulation layer 40 has a thin film encapsulation structure, as shown in FIG. 13.

Figure 14:
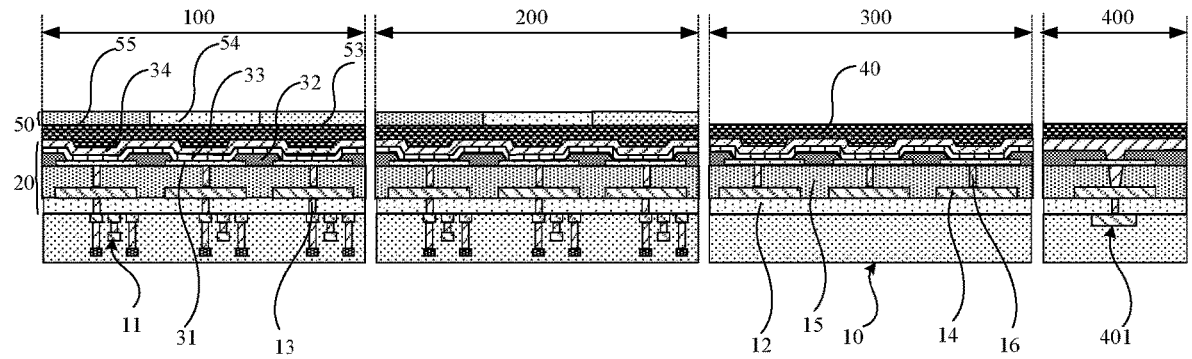
FIG. 14 is a schematic diagram of a display substrate of the present disclosure after a color filter layer is formed.

(8) On the silicon-based substrate 10 with the above-mentioned structure, a pattern of a color filter layer 50 is formed in the display region 100, the offset region 200, the dummy pixel region 300 and the cathode ring 400. The color filter layer 50 of the display region 100 and the offset region 200 includes a first color unit 53, a second color unit 54 and a third color unit 55 arranged at intervals or overlapping each other, and the color film layer 50 of the dummy pixel area 300 and the cathode ring 400 includes a first color unit 53 and a second color unit 54 stacked on the encapsulation layer from bottom to top, as shown in FIG. 14. In an exemplary embodiment, the first color unit may be a green unit G, the second color unit may be a red unit R, and the third color unit may be a blue unit B. In some possible implementations, the preparation process of the color filter layer 50 includes: first forming a blue unit B, then forming a red unit R, and then forming a green unit G. The adhesion of the blue color filter is high, and the possibility of peeling off the color filter layer 50 from the cathode can be reduced by forming the blue unit B first. The red unit R has small adhesion but good fluidity, so the quantity of bubbles on the surfaces of the blue unit B and red unit R far away from the cathode can be reduced in the process of forming the red unit R, and the uniformity of film thickness at the overlapping position of the blue unit B and red unit R can be improved. The matrix material of the green unit G and the matrix material of the red unit R are approximately the same, so the adhesion between the green unit G and the red unit R is large, which can reduce the possibility of peeling off the color filter layer 50 from the cathode. In some possible implementations, the color filter layer 50 may include other color units, such as white or yellow.

In the subsequent process, the cover panel 60 is formed by a sealing process, and the cover panel 60 and the silicon-based substrate 10 are fixed by a sealant. Since the silicon-based substrate 10, the cover panel 60 and the sealant together form a closed space, the guarantee of blocking moisture and oxygen is provided, and the service life of the silicon-based OLED display substrate is greatly prolonged. Subsequently, the formed display motherboard is cut to form an independent display substrate.

Figure 15:
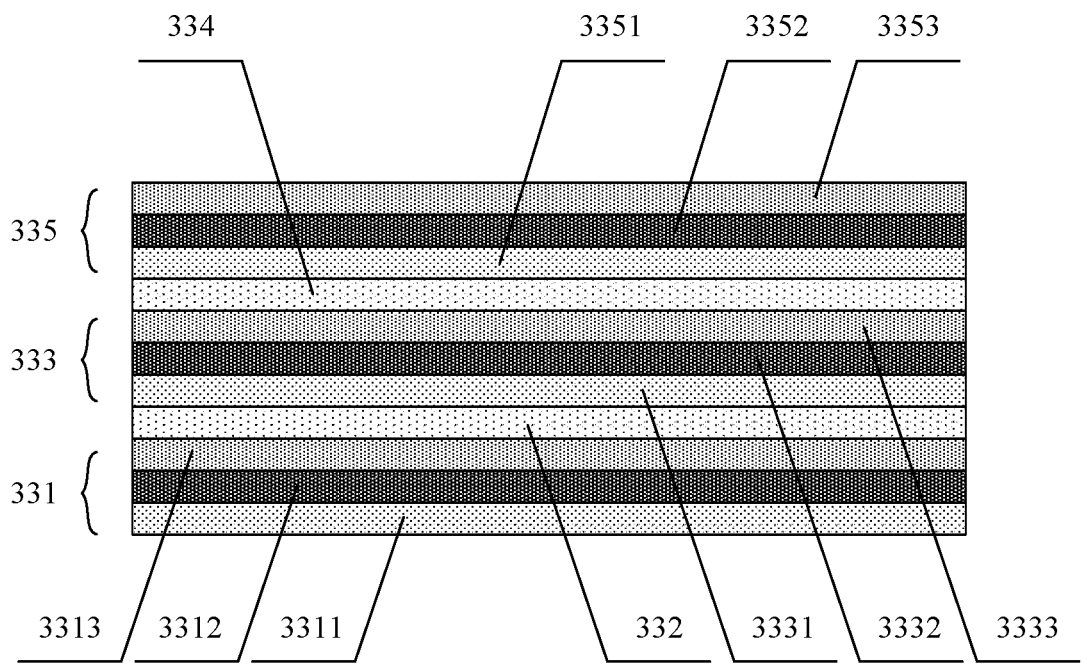
FIG. 15 is a schematic structural diagram of an organic emitting layer of the present disclosure.

FIG. 15 is a schematic diagram of a structure of an organic emitting layer of the present disclosure. As shown in FIG. 15, the structure of the organic emitting layer of the present disclosure includes a first emitting sublayer 331, a first charge generating layer 332, a second emitting sublayer 333, a second charge generating layer 334 and a third emitting sublayer 335 sequentially stacked between an anode and a cathode. The first emitting sublayer 331 is configured to emit light of a first color, and includes a first hole transporting layer (HTL) 3311, a first emitting material layer (EML) 3312, and a first electron transporting layer (ETL) 3313 which are sequentially stacked. The second emitting sublayer 333 is configured to emit light of a second color, and includes a second hole transporting layer 3331, a second emitting material layer 3332 and a second electron transporting layer 3333 stacked sequentially. The third emitting sublayer 335 is configured to emit light of a third color, and includes a third hole transporting layer 3351, a third emitting material layer 3352 and a third electron transporting layer 3353 stacked sequentially. The first charge generating layer 332 is arranged between the first emitting sublayer 331 and the second emitting sublayer 333, and is configured to connect the two emitting sublayers in series to achieve carrier transfer. The second charge generating layer 334 is arranged between the second emitting sublayer 333 and the third emitting sublayer 335, and is configured to connect the two emitting sublayers in series to achieve carrier transfer. Since the organic emitting layer of the present disclosure includes a first emitting material layer emitting light of a first color, a second emitting material layer emitting light of a second color, and a third emitting material layer emitting light of a third color, therefore the light eventually emitted by the organic emitting layer is mixed light. For example, it may be arranged that the first emitting material layer is a red light material layer emitting red light, the second emitting material layer is a green light material layer emitting green light, and the third emitting material layer is a blue light material layer emitting blue light, and therefore, the organic emitting layer eventually emits white light.

In an exemplary embodiment, the organic emitting layer shown in FIG. 15 is only an exemplary structure, which is not limited by the present disclosure. In practice, the structure of the organic emitting layer can be designed according to actual needs. For example, in each emitting sublayer, in order to improve the efficiency of injecting electrons and holes into the emitting material layer, a Hole Injection Layer (HIL) and an Electron Injection Layer (EIL) may be provided. For another example, in order to simplify the structure of the organic emitting layer, the first electron transport layer 3313, the first charge generating layer 332, and the second hole transport layer 3331 may be canceled, that is, the second emitting material layer 3332 is arranged directly on the first emitting material layer 3312.

In some possible implementations, the organic emitting layer may be an organic emitting layer that emits light of the first color and an organic emitting layer that emits complementary light of the first color light. The two organic emitting layers are sequentially stacked relative to the silicon-based substrate, thereby emitting white light as a whole. There is no restriction on the present disclosure, as long as the white light can be realized.

It can be seen from the structure of the display substrate and the preparation process of the present disclosure that: by setting the offset region, when some first pixel units in the display region at a certain edge of the display module are damaged due to packaging, pasting and other processes, the position of the actual display region can be adjusted to move toward the offset region, so as to avoid the pixel units damaged by the packaging paster, so as to ensure that the number of actually displayed pixels is consistent with the number of pre-designed pixels.

The preparation process disclosed by the present disclosure can be realized by using mature preparation equipment, and has small improvement on the process, high compatibility, simple process flow, easy periodic maintenance of equipment, high production efficiency, low production cost, high yield and convenience for mass production. The prepared display substrate can be applied to virtual reality equipment, enhanced display equipment or other types of display devices, and has good application prospects.

The structure shown in the present disclosure and its preparation process are only an exemplary description. In an exemplary embodiment, according to actual needs, the corresponding structure can be changed and the patterning process can be increased or decreased. For example, the length of the microcavity structure of each display unit may be the same or may be different. In another example, in the process of forming the reflective electrode in the display region, the corresponding bonding pad can be formed in the bonding region, which is not specifically limited in the present disclosure.

Figure 16:
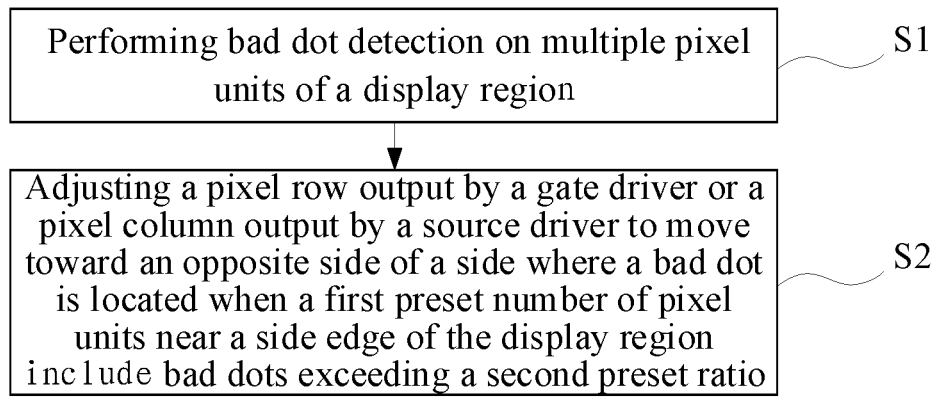
FIG. 16 is a flowchart of a display method of the present disclosure.

The present disclosure also provides a display method, as shown in FIG. 16, which includes steps S1 to S2.

Step S1 includes: performing bad dot detection on multiple pixel units of a display region.

In an exemplary embodiment, performing the bad dot detection on the multiple pixel units of the display region includes: arranging the multiple pixel units of the display region into groups; driving multiple groups to emit light in sequence; and when each group emits light, determining whether a group includes bad dots and the number of the bad dots included according to whether pixel units in the group emit light or not.

Step S2 includes: adjusting a pixel row output by a gate driver or a pixel column output by a source driver to move toward an opposite side of a side where a bad dot is located when a first preset number of pixel units near a side edge of the display region include bad dots exceeding a second preset ratio.

In an exemplary embodiment, adjusting the pixel row output by the gate driver or the pixel column output by the source driver to move toward the opposite side of the side where the bad dot is located includes:

in an initial display, driving, by the gate driver and the source driver, pixel units from row A to row B and column C to column D for display; adjusting pixel columns output by the source driver to be column (C+N+1) to column (D+N+1) when pixel units from column C to column (C+N) near a left side edge of the display region include bad dots exceeding a second preset ratio; adjusting pixel columns output by the source driver to be column (C−N−1) to column (D−N−1) when pixel units from column (D−N) to column D near a right side edge of the display region include bad dots exceeding a second preset ratio; adjusting pixel rows output by the gate driver to be row (A+M+1) to row (B+M+1) when pixel units from row A to row (A+M) near an upper side edge of the display region include bad dots exceeding a second preset ratio; and adjusting pixel rows output by the gate driver to be row (A−M−1) to row (B−M−1) when pixel units from row (B−M) to row B near a lower side edge of the display region include bad dots exceeding a second preset ratio. A, B, C, D, N, and M are all natural numbers greater than or equal to 1, and A<B, C<D, N<C, M<A.

Exemplarily, A=17, B=1937, C=17, D=1097, the number of pixel columns in the left offset region or in the right offset region are all 16 columns, the number of pixel rows in the upper offset region or in the lower offset region are all 16 rows, and the second preset ratio is 50%. Pixel columns output by the source driver are adjusted to be column 21 to column 1101 when pixel units from column 17 to column 20 near a left side edge of the display region include bad dots exceeding 50%. Pixel columns output by the source driver are adjusted to be column 13 to column 1093 when pixel units from column 1094 to column 1097 near a right side edge of the display region include bad dots exceeding 50%. Pixel rows output by the gate driver are adjusted to be row 21 to row 1941 when pixel units from row 17 to row 20 near an upper side edge of the display region include bad dots exceeding 50%. Pixel rows output by the gate driver are adjusted to be row 13 to row 1933 when pixel units from row 1934 to row 1937 near a lower side edge of the display region include bad dots exceeding 50%.

According to the display method of the embodiment, a pixel row output by a gate driver or a pixel column output by a source driver is adjusted to move toward an opposite side of a side where a bad dot is located when a first preset number of first pixel units near a side edge of the display region include bad dots exceeding a second preset ratio. As a result, when some pixel units in the display region at a certain edge of the display module are damaged due to packaging, pasting or other processes, the position of the actual display region can be adjusted, so as to avoid the pixels damaged by the packaging or pasting, so as to ensure that the number of actually displayed pixels is consistent with the number of pre-designed pixels.

The present disclosure further provides a display device, including the aforementioned display substrate. The display device may be a virtual reality device, an augmented reality device, or a near-eye display device, or may be a mobile phone, a tablet computer, a television, a monitor, a notebook computer, a digital photo frame or a navigator, or any other product or component with a display function. The display device also includes a gate driver, a source driver and a timing controller.

The gate driver is connected to the display substrate through the row scan line GL and configured to receive a gate control signal GCS output by the timing controller, generate a scanning signal, transmit the scanning signal to an actual display region on the display substrate through a scanning line GL. The actual display region is adjusted according to the position and number of bad dots of first pixel units on the display substrate.

The source driver is configured to receive the data voltage Vdata and the source control signal SCS output by the timing controller, generate corresponding data voltage signals and output them to the actual display region on the display substrate through the data line DL. The actual display region is adjusted according to the position and number of bad dots of pixel units on the display substrate.

The timing controller is configured to receive RGB (red, green, blue) data and timing control signals which are externally input; and generate data voltages Vdata and source control signals SCS according to the RGB data, timing control signals and pixel columns to be output, output the data voltages and source control signals to the source driver, generate gate driving signals GCS according to pixel rows to be output, and output the gate driving signals GCS to the gate driver.

In an exemplary embodiment, adjusting the actual display region according to the position and number of the bad dots of the first pixel units on the display substrate includes: in an initial display, driving, by the gate driver and the source driver, pixel units from row A to row B and column C to column D for display; driving, by the gate driver and the source driver, pixel units from row A to row B and column (C+N+1) to column (D+N+1) for display when pixel units from column C to column (C+N) near a left side edge of the display region include bad dots exceeding a second preset ratio; driving, by the gate driver and the source driver, pixel units from row A to row B and column (C−N−1) to column (D−N−1) for display when pixel units from column (D−N) to column D near a right side edge of the display region include bad dots exceeding a second preset ratio; driving, by the gate driver and the source driver, pixel units from row (A+M+1) to row (B+M+1) and column C to column D for display when pixel units from row A to row (A+M) near an upper side edge of the display region include bad dots exceeding a second preset ratio; and driving, by the gate driver and the source driver, pixel units from row (A−M−1) to row (B−M−1) and column C to column D for display when pixel units from row (B−M) to row B near a lower side edge of the display region include bad dots exceeding a second preset ratio. A, B, C, D, N, and M are all natural numbers greater than or equal to 1, and A<B, C<D, N<C, M<A.

Exemplarily, A=17, B=1937, C=17, D=1097, the number of pixel columns in the left offset region or in the right offset region are all 16 columns, the number of pixel rows in the upper offset region or in the lower offset region are all 16 rows, and the second preset ratio is 50%. Pixel columns output by the source driver are column 21 to column 1101 when pixel units from column 17 to column 20 near a left side edge of the display region include bad dots exceeding 50%. Pixel columns output by the source driver are column 13 to column 1093 when pixel units from column 1094 to column 1097 near a right side edge of the display region include bad dots exceeding 50%. Pixel rows output by the gate driver are row 21 to row 1941 when pixel units from row 17 to row 20 near an upper side edge of the display region include bad dots exceeding 50%. Pixel rows output by the gate driver are row 13 to row 1933 when pixel units from row 1934 to row 1937 near a lower side edge of the display region include bad dots exceeding 50%.

Although implementations disclosed in the present disclosure are as the above, the described contents are only implementations used for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

What is claimed is:

1. A display device, comprising: a display substrate, a gate driver, a source driver and a timing controller, wherein:

the display substrate comprises a display region and an offset region surrounding the display region;

in a direction perpendicular to a plane of the display substrate, the display substrate comprises a silicon-based substrate, an emitting structure layer arranged on the silicon-based substrate, and an encapsulation layer arranged on a side of the emitting structure layer far away from the silicon-based substrate, the silicon-based substrate in the display region is integrated with first pixel driving circuits, and the silicon-based substrate in the offset region is integrated with second pixel driving circuits;

the first pixel driving circuits are connected with the emitting structure layer of the display region, and at least part of the first pixel driving circuits are configured to provide driving signals for the emitting structure layer electrically connected with the first pixel driving circuits during normal display;

the second pixel driving circuits are connected with the emitting structure layer of the offset region, and at least part of the second pixel driving circuits are configured to provide no driving signals for the emitting structure layer electrically connected with the second pixel driving circuits during normal display;

the gate driver is configured to receive a gate control signal output by the timing controller, generate scanning signals, and transmit the scanning signals to an actual display region on the display substrate through a scanning line, wherein the actual display region is adjusted according to a position and a quantity of bad dots of pixel units on the display substrate;

the source driver is configured to receive data voltage signals and source control signals output by the timing controller, generate corresponding data voltage signals and output the data voltage signals to the actual display region on the display substrate through a data line;

the timing controller is configured to receive red, green and blue data and timing control signals input externally, generate data voltage signals and source control signals according to the red, green and blue data and the timing control signals, output the data voltage signals and the source control signals to the source driver, generate gate driving signals, and output the gate driving signals to the gate driver; and the actual display region being adjusted according to the position and the quantity of the bad dots of the pixel units on the display substrate is configured to:

in an initial display, drive, by the gate driver and the source driver, pixel units from row A to row B and column C to column D to display;

drive, by the gate driver and the source driver, pixel units from row A to row B and column (C+N+1) to column (D+N+1) to display when pixel units from column C to column (C+N) near a left side edge of the display region comprise bad dots exceeding a second preset ratio;

drive, by the gate driver and the source driver, pixel units from row A to row B and column (C−N−1) to column (D−N−1) to display when pixel units from column (D−N) to column D near a right side edge of the display region comprise bad dots exceeding the second preset ratio;

drive, by the gate driver and the source driver, pixel units from row (A+M+1) to row (B+M+1) and column C to column D to display when pixel units from row A to row (A+M) near an upper side edge of the display region comprise bad dots exceeding the second preset ratio; and drive, by the gate driver and the source driver, pixel units from row (A−M−1) to row (B−M−1) and column C to column D to display when pixel units from row (B−M) to row B near a lower side edge of the display region comprise bad dots exceeding the second preset ratio, wherein A, B, C, D, N, and M are all natural numbers greater than or equal to 1, and A<B, C<D, N<C, M<A.

2. The display device according to claim 1, wherein all the first pixel driving circuits are configured to provide driving signals for the emitting structure layer electrically connected with the first pixel driving circuits.

3. The display device according to claim 1, wherein the offset region comprises a left offset region, a right offset region and/or an upper offset region and a lower offset region, and wherein a difference between a number of columns of pixel units contained in the left offset region and a number of columns of pixel units contained in the right offset region does not exceed 10 columns, and a difference between a number of rows of pixel units contained in the upper offset region and a number of rows of pixel units contained in the lower offset region does not exceed 10 rows.

4. The display device according to claim 3, wherein the left offset region and the right offset region contain the same number of columns of pixel units, and the upper offset region and the lower offset region contain the same number of rows of pixel units.

5. The display device according to claim 3, wherein:
a ratio of the number of columns of pixel units in the left offset region or the right offset region to a number of columns of pixel units in the display region is greater than or equal to 1%; and a ratio of the number of rows of pixel units in the upper offset region or the lower offset region to a number of rows of pixel units in the display region is greater than or equal to 1%.

6. The display device according to claim 1, further comprising a color filter layer arranged on one side of the encapsulation layer away from the emitting structure layer, wherein the color filter layer disposed in the display region and the color filter layer disposed in the offset region each comprises a first color unit, a second color unit and a third color unit arranged in an array.

7. The display device according to claim 1, further comprising a dummy pixel region at least partially surrounding the offset region, wherein in the direction perpendicular to the plane of the display substrate, the dummy pixel region comprises a silicon-based substrate, an emitting structure layer arranged on the silicon-based substrate, and an encapsulation layer arranged on a side of the emitting structure layer far away from the silicon-based substrate.

8. A display method, comprising:
performing bad dot detection on multiple pixel units of a display region; and adjusting a pixel row output by a gate driver or a pixel column output by a source driver to move toward an opposite side of a side where a bad dot is located when a first preset number of pixel units near a side edge of the display region comprise one or more bad dots exceeding a second preset ratio;

wherein adjusting the pixel row output by the gate driver or the pixel column output by the source driver to move toward the opposite side of the side where the bad dot is located when the first preset number of the pixel units near the side edge of the display region comprises the one or more bad dots exceeding the second preset ratio comprises:

in an initial display, driving, by the gate driver and the source driver, pixel units from row A to row B and column C to column D to display;

adjusting pixel columns output by the source driver to be column (C+N+1) to column (D+N+1) when pixel units from column C to column (C+N) near a left side edge of the display region comprise the bad dots exceeding a second preset ratio;

adjusting pixel columns output by the source driver to be column (C−N−1) to column (D−N−1) when pixel units from column (D−N) to column D near a right side edge of the display region comprise the bad dots exceeding the second preset ratio;

adjusting pixel rows output by the gate driver to be row (A+M+1) to row (B+M+1) when pixel units from row A to row (A+M) near an upper side edge of the display region comprise the bad dots exceeding the second preset ratio; and adjusting pixel rows output by the gate driver to be row (A−M−1) to row (B−M−1) when pixel units from row (B−M) to row B near a lower side edge of the display region comprise the bad dots exceeding the second preset ratio, wherein A, B, C, D, N, and M are all natural numbers greater than or equal to 1, and A<B, C<D, N<C, M<A.

9. The display method according to claim 8, wherein performing the bad dot detection on the multiple pixel units of the display region comprises:

arranging the multiple pixel units of the display region into groups;

driving multiple groups to emit light in sequence; and when each group emits light, determining whether a group comprises one or more bad dots and a number of the bad dots comprised according to whether a pixel unit in the group emits light or not.

\* \* \* \* \*